(12) United States Patent
Milano et al.

(10) Patent No.: US 6,611,159 B1
(45) Date of Patent: Aug. 26, 2003

(54) APPARATUS AND METHOD FOR SYNCHRONIZING MULTIPLE CIRCUITS CLOCKED AT A DIVIDED PHASE LOCKED LOOP FREQUENCY

(75) Inventors: Louis C. Milano, Endwell, NY (US); Eric E. Retter, Warren Center, PA (US); Roger S. Rutter, Owego, NY (US); Michael P. Vachon, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 10/078,224

(22) Filed: Feb. 19, 2002

(51) Int. Cl.⁷ ................................................. H03L 7/06
(52) U.S. Cl. ...................... 327/147; 327/156; 327/159; 331/11
(58) Field of Search ................................. 327/147, 148, 327/150, 156, 157, 159, 162, 141; 375/356, 373, 374, 375; 331/11, 14, 25

(56) References Cited

U.S. PATENT DOCUMENTS 5,294,894 A * 3/1994 Gebara ....................... 331/1 A
5,949,262 A   9/1999 Dreps et al. ................. 327/156
6,112,308 A   8/2000 Self et al. .................... 713/400
6,172,937 B1  1/2001 Ilkbahar et al. ............. 365/233
6,252,444 B1  6/2001 Lee ............................. 327/156
6,463,013 B1 * 10/2002 Liu et al. ..................... 368/155
2002/0145457 A1 * 10/2002 Sumi .......................... 327/159

OTHER PUBLICATIONS

IBM Technical Disclosure Bulletin, Cascade Digital Phase Aligner, vol. 39 No. 07, Jul. 1996, pp. 145–147.

* cited by examiner

Primary Examiner—Tuan T. Lam
(74) Attorney, Agent, or Firm—John A. Merecki; Hoffman, Warnick & D'Alessandro

(57) ABSTRACT

An apparatus and method for synchronizing multiple circuits or chips clocked at a divided phase lock loop (PLL) frequency. The apparatus generally includes a plurality of chips, each chip including a phase locked loop (PLL) and a circuit for generating a system clock signal, a circuit for receiving the lock signal from each PLL and for generating an All-Locked signal in response to all of the PLLs achieving lock, and a synchronizing circuit for synchronizing the system clocks of the plurality of chips upon receipt of the All-Locked signal.

20 Claims, 6 Drawing Sheets

APPARATUS AND METHOD FOR SYNCHRONIZING MULTIPLE CIRCUITS CLOCKED AT A DIVIDED PHASE LOCKED LOOP FREQUENCY

BACKGROUND OF THE INVENTION

1. Field of the Invention

The present invention relates generally to the synchronization of multiple circuits or integrated circuit chips. In particular, the present invention relates to an apparatus and method for ensuring that multiple circuits or chips generate system clocks that are in phase with one another.

2. Related Art

A problem often arises when multiple circuits, or chips, or combinations thereof, are coupled together as a synchronized system, but are each driven by their own phase locked loop (PLL). If each circuit or chip requires the PLL output frequency to be divided down to a lower frequency to generate its operating (i.e., system) clock frequency, then the possibility exists that, after a reset, and the individual PLLs each acquire lock, the circuits or chips could start operating with clocks that are out of phase with each other. This problem may exist even when the PLLs of the individual circuits or chips are driven by the same input oscillator source.

The above-referenced problem is illustrated in greater detail with reference to FIGS. 1 and 2.

A system 10 comprising two chips 12A, 12B, each containing a PLL 14A, 14B, is illustrated in FIG. 1. Each PLL 14A, 14B, is driven by a 30 MHz input clock signal 16 produced by a 30 MHz oscillator (not shown), and is configured to provide an output frequency of 120 MHz. If each chip 12A, 12B, has a required operating frequency (i.e., system clock) of 40 MHz, the output clock signal 18A, 18B, of each PLL 14A, 14B, must be divided by a factor of three in order to generate a system clock signal 20A, 20B, having the desired clock frequency. In this example, a divide-by-three circuit 22A, 22B, is provided in each chip 12A, 12B, to furnish the necessary frequency division.

After a reset signal 24 is provided to the PLLs 14A, 14B, each PLL 14A, 14B, will take some period of time to become locked. A typical system, e.g., system 10, uses this lock indication to begin propagating the system clock signal 20A, 20B, to the internal logic of the chips 12A, 12B. Since both PLLs 14A, 14B, are driven by a common input clock signal 16, the output clock signals 18A, 18B of the PLLs 14A, 14B, once locked, are guaranteed to be in phase. However, since the example system 10 includes a divide-by-three circuit 22A, 22B, on the output of each PLL 14A, 14B, the exact startup time of each divide-by-three circuit 22A, 22B, will affect the phase relationship of the resultant system clock signals 20A, 20B. The timing diagram shown in FIG. 2 illustrates how, if each PLL 14A, 14B, becomes locked at a slightly different time, the resultant system clock signals 20A, 20B, will be out of phase.

To compound this problem, some PLL configurations, based on the amount of jitter present on the input clock signal, may momentarily lose lock even though continuing to produce acceptable output clock signals. This causes the interruption of system clock generation for those systems that use the locked indicator as a gating condition. Further, it is also possible that one or more PLLs in the system do not achieve lock at all.

A need therefore exists for a solution which addresses both the problem of synchronization of multiple circuits or chips, as well as the problem of momentary (or permanent) deactivation of the PLL locked indication.

SUMMARY OF THE INVENTION

The present invention provides an apparatus and method for synchronizing multiple circuits or chips clocked at a divided phase lock loop (PLL) frequency.

Generally, the present invention provides an apparatus comprising:

a plurality of chips, each chip including a phase locked loop (PLL) and a circuit for generating a system clock signal;

a circuit for receiving the lock signal from each PLL and for generating an All-Locked signal in response to all of the PLLs achieving lock; and a synchronizing circuit for synchronizing the system clocks of the plurality of chips upon receipt of the All-Locked signal In addition, the present invention provides a method comprising:

providing a plurality of chips, each chip including a phase locked loop (PLL) and a circuit for generating a system clock signal;

generating an All-Locked signal in response to all of the PLLs achieving lock; and synchronizing the system clock signals of the plurality of chips in response to receipt of the All-Locked signal, wherein the system clock signals are in phase.

The foregoing and other features of the invention will be apparent from the following more particular description of the invention.

BRIEF DESCRIPTION OF THE DRAWINGS

The features of the present invention will best be understood from a detailed description of the invention and embodiments thereof selected for the purpose of illustration and shown in the accompanying drawings in which.

DETAILED DESCRIPTION OF THE INVENTION

Figure 1:
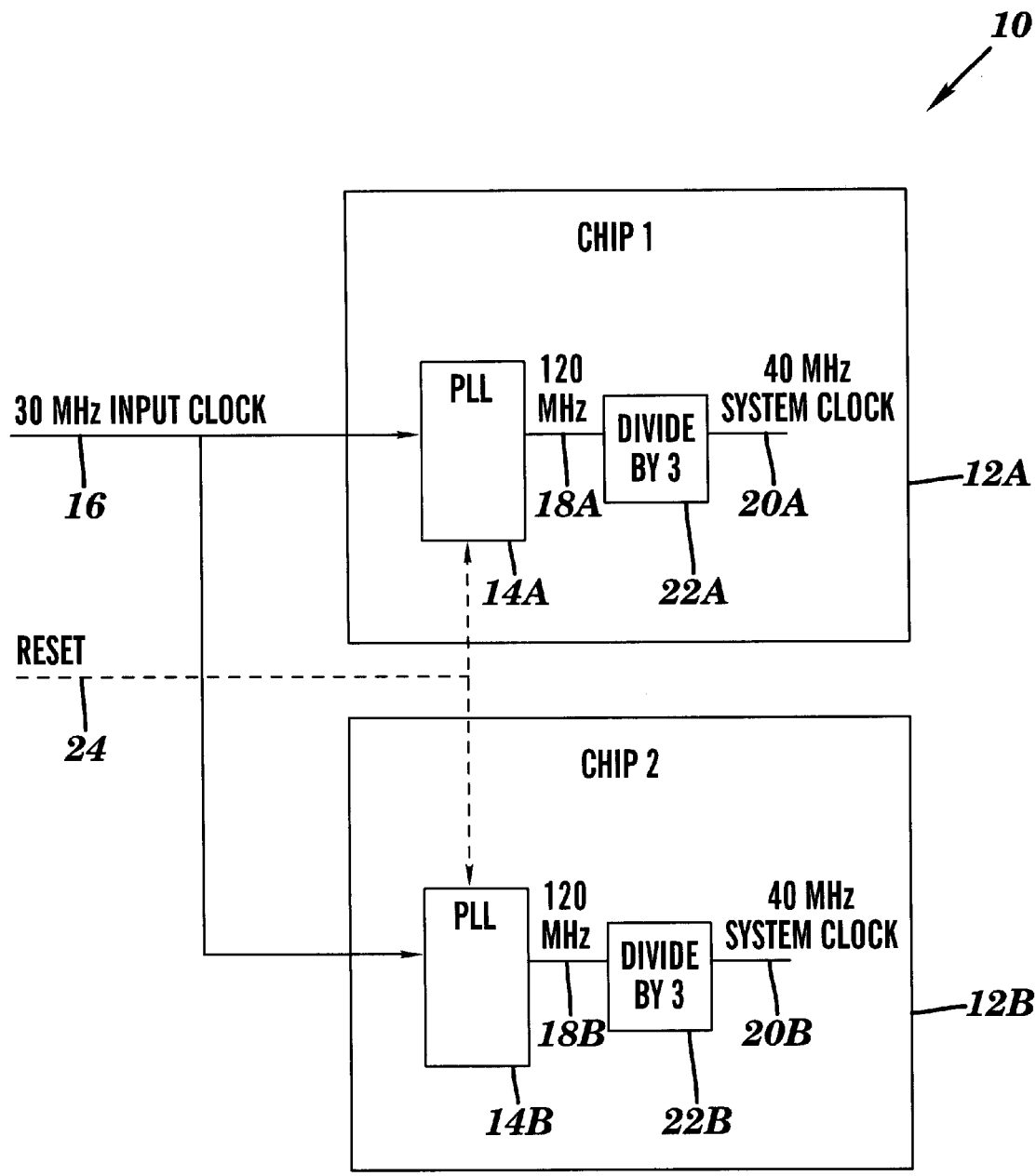
FIG. 1 illustrates a two-chip synchronized system of the related art.
Figure 2:
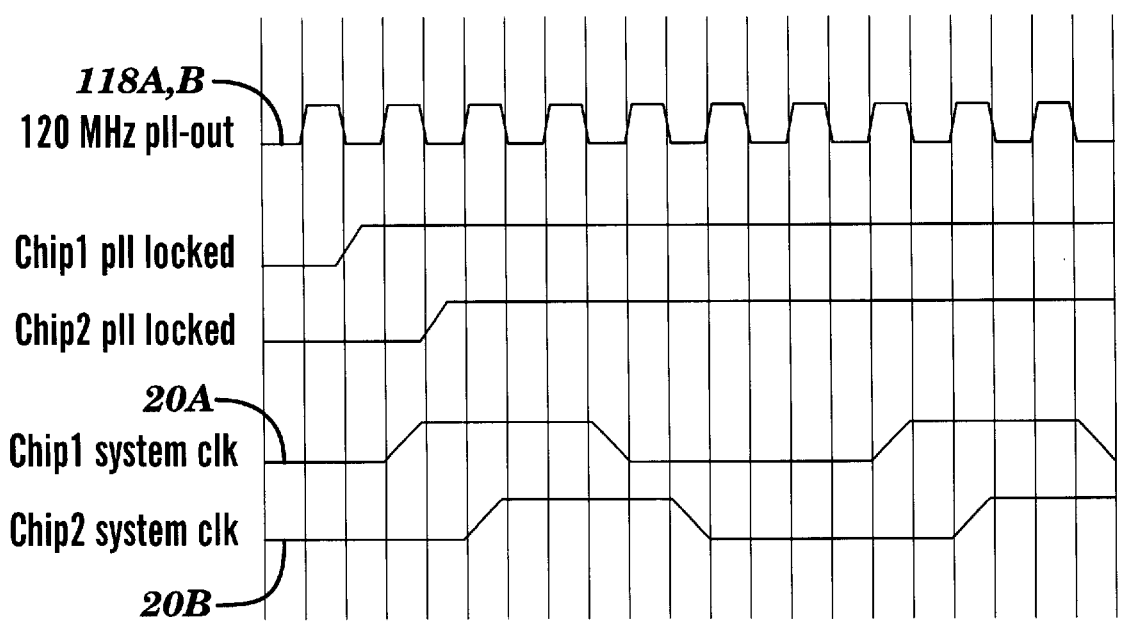
FIG. 2 is a timing diagram corresponding to the system of FIG. 1, wherein the resultant system clock signals are out of phase.

The features of the present invention are illustrated in detail in the accompanying drawings, wherein like reference numerals refer to like elements throughout the drawings.

Figure 3:
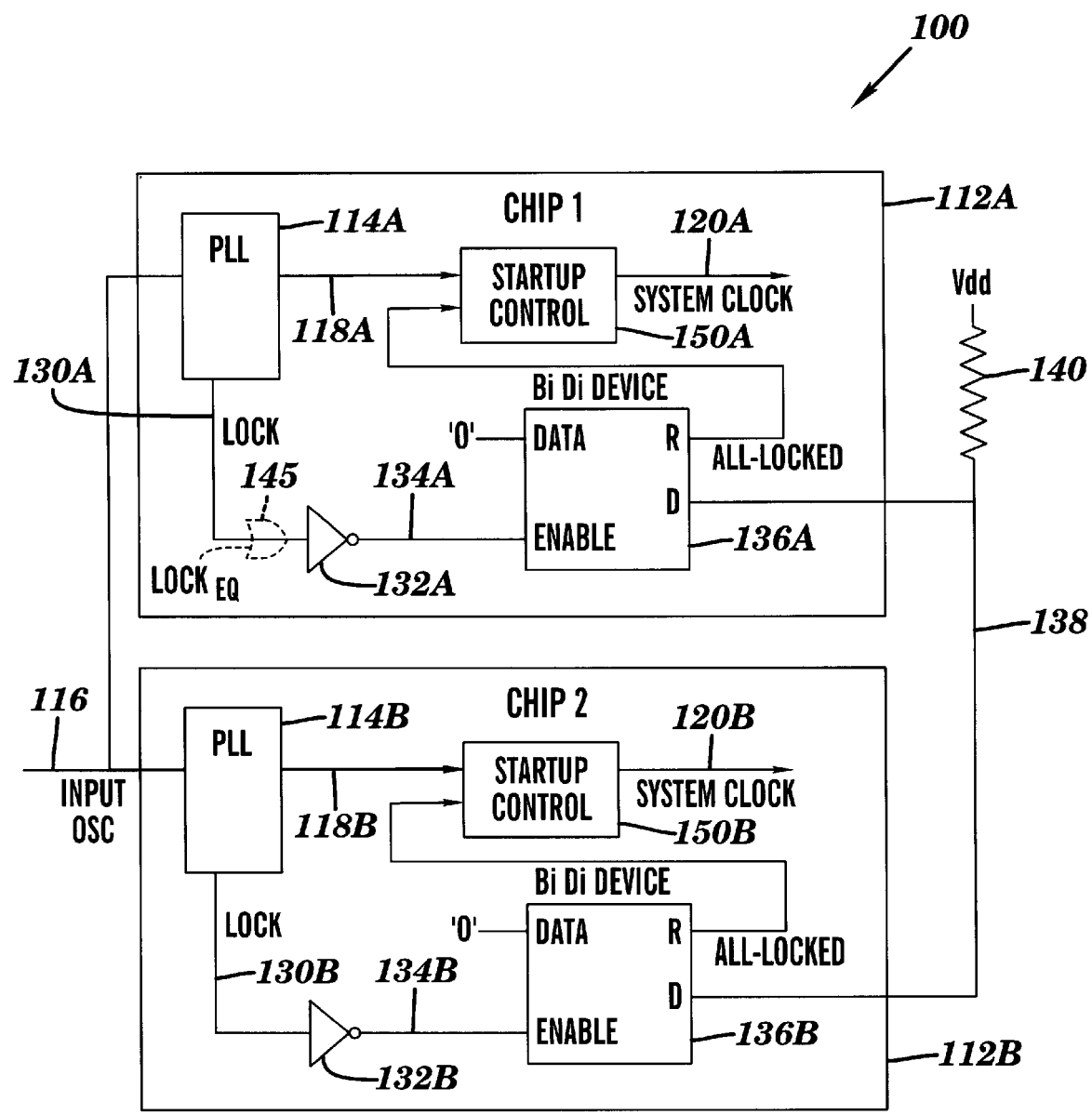
FIG. 3 illustrates a two-chip synchronized system in accordance with the present invention.

A system 100 comprising two chips 112A, 112B, each containing a PLL 114A, 114B, in accordance with the present invention, is illustrated in FIG. 3. While only two chips are shown, it should be apparent from the following description that any number of chips (or alternately circuits and/or combinations of chips and circuits) could be present within the system 100. Each PLL 114A, 114B, is driven by an input clock signal 116 produced by an oscillator (not shown), and is configured to provide an output clock signal 118A, 118B, having an output frequency which is a multiple (e.g., 4×) of the frequency of the input clock signal 116.

Depending upon the required operating frequency (i.e., system clock) of each chip 112A, 112B, the output clock signal 118A, 118B, of each PLL 114A, 114B, is typically divided (or multiplied) by a predetermined amount in order to generate a system clock signal 120A, 120B, having the desired clock frequency. In the timing diagram of FIG. 5, for example, which corresponds to the system 100 of FIG. 3, the output clock signal 118A, 118B, of each PLL 114A, 114B, is divided by three (e.g., using a divide-by three circuit) in order to generate a system clock signal 120A, 120B, having a clock frequency that is one-third that of its respective PLL output clock signal.

Each PLL 114A, 114B, generates a lock signal 130A, 130B, indicating the lock status of the PLL after reset. In this example, a lock is represented as a logic '1', while a no-lock is represented as a logic '0'. Each lock signal 130A, 130B, is fed through an inverter 132A, 132B. The output 134A, 134B, of each inverter 132A, 132B, is coupled to the Enable input of a bi-directional driver/receiver device 136A, 136B. Thus, bi-directional driver/receiver device 136A is enabled as long as PLL 114A does not achieve lock, and bi-directional driver/receiver device 136B is enabled as long as PLL 114B does not achieve lock. A logic '0' value is presented to the Data input of each bi-directional driver/receiver device 136A, 136B. Accordingly, the D output of each bi-directional driver/receiver device 136A, 136B, is driven to logic '0' as long as its corresponding PLL 114A, 114B, fails to achieve lock.

The D outputs of the bi-directional driver/receiver devices 136A, 136B, are coupled in parallel by a wire 138 to Vdd through a pull-up resistor 140. The signal on the wire 138 is hereafter referred to as the All-Locked signal. In this configuration, the All-Locked signal on wire 138 is driven to logic '0' as long as either (or both) of the PLLs 114A, 114B, fail to achieve lock. In other words, the All-Locked signal on wire 138 is the logical AND of the PLL lock signals produced by PLLs 114A, 114B (i.e., the PLL lock signals are effectively "wire-ANDed" together.

When PLL 114A achieves lock, the output 134A of inverter 132A provides a logic '0' to the Enable input of the bi-directional driver/receiver device 136A, thereby disabling the bi-directional driver/receiver device 136A (i.e., the bi-directional driver/receiver device 136A enters a high impedance tri-state mode). Similarly, when PLL 114B achieves lock, the output 134B of inverter 132B provides a logic '0' to the Enable input of the bi-directional driver/receiver device 136B, thereby disabling the bi-directional driver/receiver device 136B.

The pull-up resistor 140 connecting the All-Locked signal on wire 138 to Vdd will pull the All-Locked signal to a logic '1' once both of the bi-directional driver/receiver devices 136A, 136B, have been tri-stated, indicating that the PLLs 114A, 114B, in both of the chips 112A, 112B, have achieved PLL lock. As the final PLL achieves lock, both of the chips 112A, 112B, in the system 100 simultaneously see a transition from logic '0' to logic '1' on the All-Locked signal on wire 138. As detailed below with reference to FIG. 4, the logic '1' All-Locked signal is latched by the external oscillator in each chip 112A, 112B, and the latched output is used to start up the divide circuitry in each chip in phase with the other chips in the system 100, thereby providing system clock signals 120A, 120B that are in phase with each other (see the timing diagram of FIG. 5). The logic '1' All-Locked signal on wire 138 is passed through each bi-directional driver/receiver device 136A, 136B, from its D input to its R output, and is provided to a startup control circuit 150A, 150B.

Figure 4:
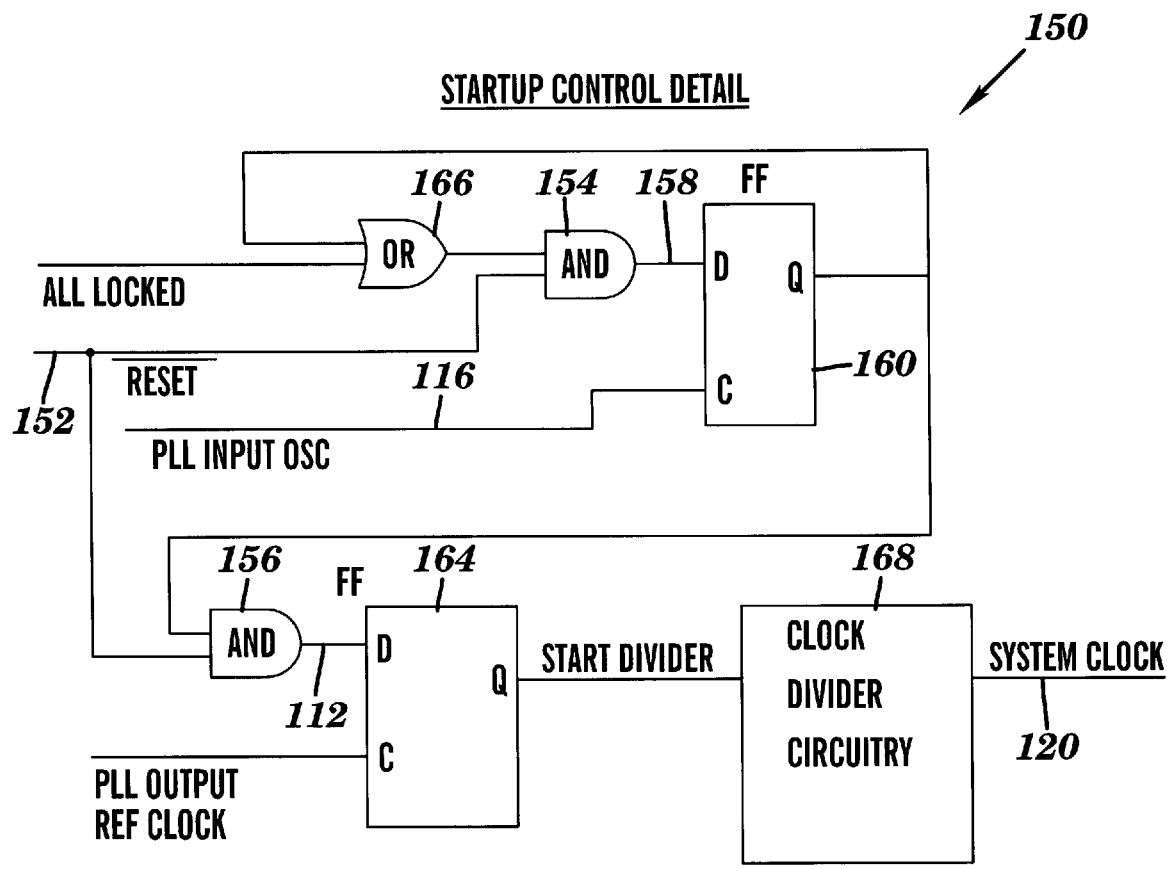
FIG. 4 is a detailed circuit diagram of the startup control block within each chip of FIG. 3.

An exemplary startup control circuit 150 is illustrated in detail in FIG. 4. Initially, a reset signal is asserted (i.e., logic '1'), and the complement 152 of the reset signal (i.e., logic '0') is supplied as an input to AND gates 154 and 156. The output 158 of AND gate 154 is coupled to the D input of flip-flop 160. The output 162 of AND gate 156 is coupled to the D input of flip-flop 164. The resultant logic '0' provided to the D inputs of flip-flops 162 and 164 sets the output Q of each flip-flop to logic '0'. The output Q of flip-flop 160 is fed back to an input of OR gate 166, and is also coupled to an input of AND gate 156. The All-Locked signal is provided to an input of OR gate 166. After the reset signal is deasserted, (i.e., the complement 152 of the reset signal is at logic '1'), the All-Locked signal is initially at logic '0', thereby indicating that at least one of the PLLs 114A, 114B in chips 112A, 112B (see FIG. 3), has not yet achieved PLL lock.

The startup control circuit 150 monitors the All-Locked signal. When the All-Locked signal transitions to logic '1', thereby indicating that both of the PLLs 114A, 114B in chips 112A, 112B, have achieved PLL lock after system reset, the output of flip-flop 160 is set to logic '1' on the next rising edge of the PLL input clock signal 116. Input clock signal 116 is the clock feeding the oscillator input of each PLL 114A, 114B, (FIG. 3), and is typically driven by an off-chip crystal oscillator (not shown). Once flip-flop 160 has been set to logic '1', it will hold the logic '1' value until the corresponding chip (e.g., 112A, 112B) is reset again. This makes the startup control circuit 150 insensitive to subsequent deassertions in the All-Locked signal.

Once flip-flop 160 has been set to logic '1', this value will transfer to the D input of flip-flop 164, through AND gate 156, at the next rising edge of the PLL output reference clock (this is usually at the same frequency as the PLL input clock signal 116, and is used by the PLL as a feedback clock). This effectively transfers the All-Locked indication into the clock domain associated with the PLL output. Note that the PLL output reference clock and the PLL input clock signal 116 are of the same frequency, but will differ in phase, thus necessitating the transfer of the All-Locked indication into the PLL output domain prior to using the signal to start the clock divider circuit 168.

Figure 5:
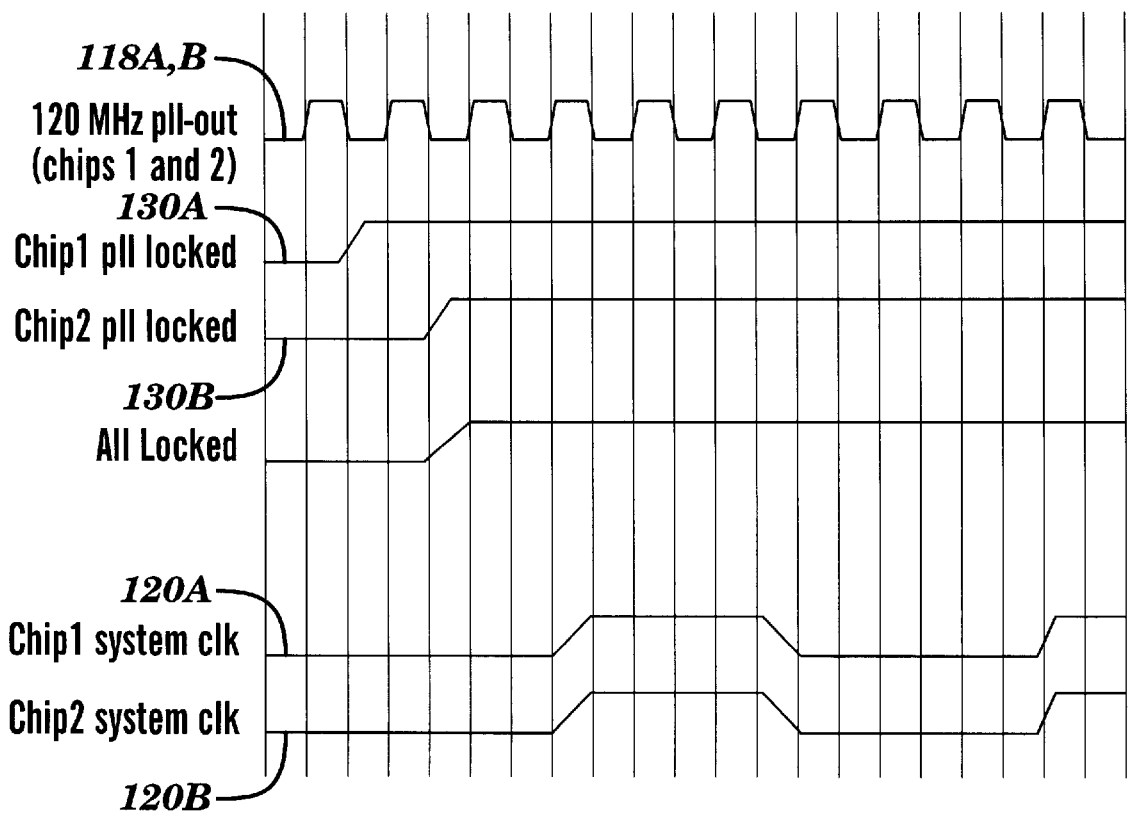
FIG. 5 is a timing diagram corresponding to the system of FIG. 3, wherein the resultant system clock signals are in phase.

Once flip-flop 164 is set to logic '1', it signals the clock divider circuitry 168 to begin dividing and generating the system clocks 120A, 120B (FIG. 3). Since each chip 112A, 112B, in system 100 sees the transition of the All-Locked signal from logic '0' to logic '1' at the same time, the start control block 150 of each chip 112A, 112B, will cycle at the same time through the above-described operations, resulting in system clocks 120A, 120B on each chip 112A, 112B, that are in phase as shown in FIG. 5.

Figure 6:
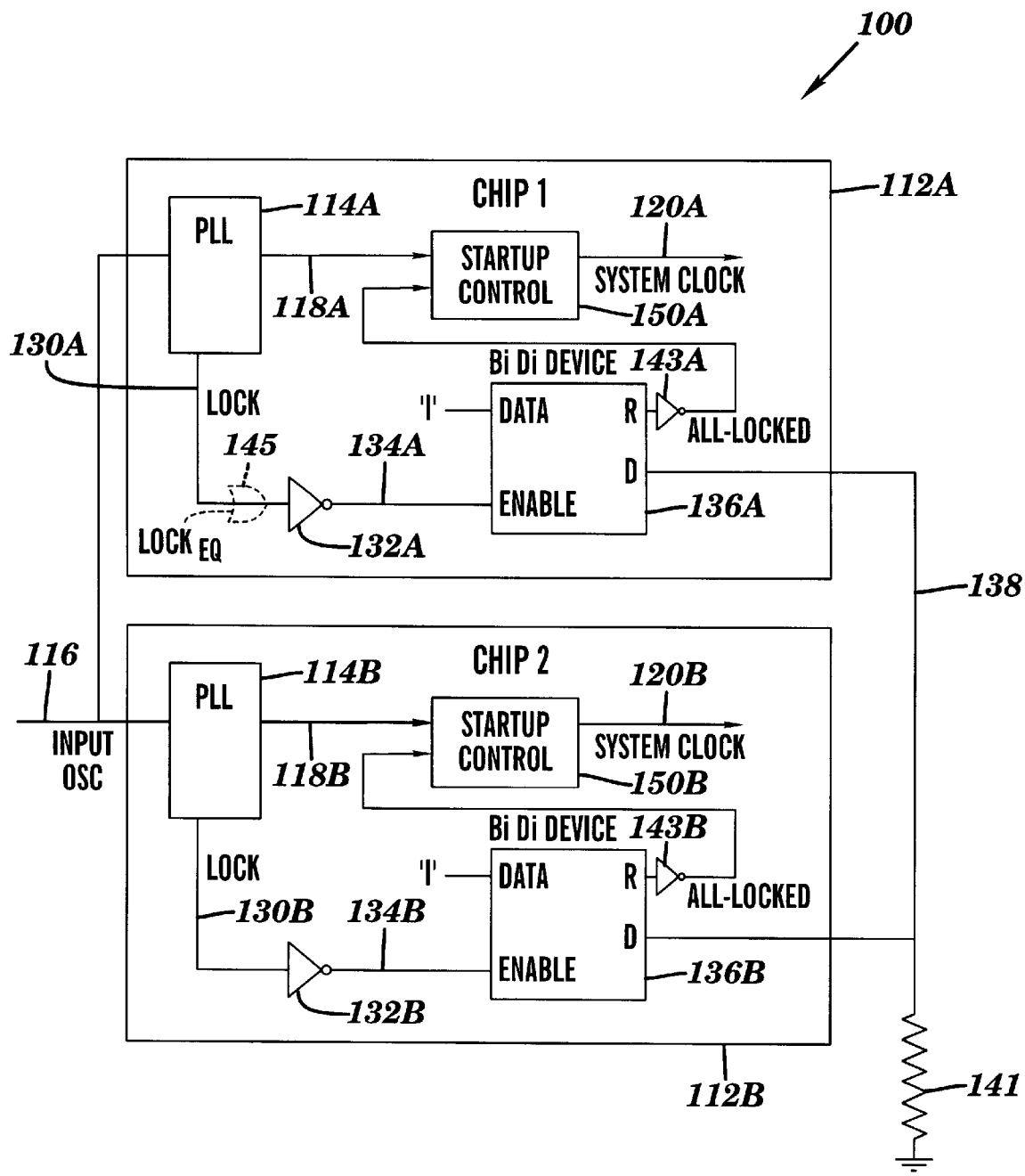
FIG. 6 illustrates a two-chip synchronized system in accordance with another embodiment of the present invention.

In another embodiment of the present invention, as illustrated in FIG. 6, the wire 138 may alternately be tied to ground through a pull-down resistor 141. In this embodiment, a logic '1' value is presented to the Data input of each bi-directional driver/receiver device 136A, 136B. Accordingly, the D output of each bi-directional driver/receiver device 136A, 136B, is driven to logic '1' as long as its corresponding PLL 114A, 114B, fails to achieve lock.

When PLL 114A achieves lock, the output 134A of inverter 132A provides a logic '0' to the Enable input of the bi-directional driver/receiver device 136A, thereby disabling the bidirectional driver/receiver device 136A (i.e., the bi-directional driver/receiver device 136A enters a high impedance tri-state mode). Similarly, when PLL 114B achieves lock, the output 134B of inverter 132B provides a logic '0' to the Enable input of the bi-directional driver/ receiver device 136B, thereby disabling the bi-directional driver/receiver device 136B.

The pull-down resistor 141 connecting wire 138 to ground will pull the signal on wire 138 to a logic '0' once both of the bi-directional driver/receiver devices 136A, 136B, have been tri-stated, indicating that the PLLs 114A, 114B, in both of the chips 112A, 112B, have achieved PLL lock (i.e., the PLL lock signals are effectively "wire-ORed" together). As the final PLL achieves lock, both of the chips 112A, 112B, in the system 100 simultaneously see a transition from logic '1' to logic '0' on the wire 138.

The logic '0' value on wire 138 is passed through each bi-directional driver/receiver device 136A, 136B, from its D input to its R output, and is inverted by an inverter 143A, 143B, thereby providing the All-Locked signal to startup control circuit 150A, 150B. As detailed above with regard to FIG. 4, the All-Locked signal is used to start up the divide circuitry in each chip in phase with the other chips in the system 100, thereby providing system clock signals 120A, 120B that are in phase with each other (see, e.g., the timing diagram of FIG. 5).

The foregoing description of the present invention has been presented for purposes of illustration and description. It is not intended to be exhaustive or to limit the invention to the precise form disclosed, and many modifications and variations are possible in light of the above teaching. For instance, if the PLL lock signal of a chip is not a stable signal or does not exist, but a lock time is defined, an alternate signal can be used as the equivalent of PLL lock. The equivalent PLL lock signal may be generated by the chip itself, or external to the chip. In either case, the equivalent PLL lock signal is generated externally from the PLL itself. The equivalent PLL lock signal may be used in lieu of the lock signal generated by the PLL, or may be used in conjunction with the lock signal, using suitable circuitry. For example, as illustrated in phantom in chip 112A of FIGS. 3 and 6, an OR gate 145, having the PLL lock signal 130A and an equivalent PLL lock signal Lock$_{EQ}$ as inputs, may be coupled to the inverter 132A. Such modifications and variations that may be apparent to a person skilled in the art are intended to be included within the scope of this invention.

We claim:

1. An apparatus comprising:
   a plurality of chips, each chip including a phase locked loop (PLL) and a circuit for generating a system clock signal;
   a circuit for receiving a lock signal corresponding to each PLL and for generating an All-Locked signal in response to all of the PLLs achieving lock; and
   a synchronizing circuit for synchronizing the system clocks of the plurality of chips in response to receipt of the All-Locked signal.

2. The apparatus of claim 1, wherein each chip further includes a bi-directional driver/receiver device for receiving the lock signal from the PLL of the chip.

3. The apparatus of claim 2, wherein each bi-directional driver/receiver device includes a driver output, and wherein the driver outputs are connected in parallel to Vdd.

4. The apparatus of claim 2, wherein each bi-directional driver/receiver device includes a driver output, and wherein the driver outputs are connected in parallel to ground.

5. The apparatus of claim 2, wherein a driver output of each bi-directional driver/receiver device is held at logic '0' until the PLL of its corresponding chip achieves lock.

6. The apparatus of claim 5, wherein the driver outputs of the bi-directional driver/receiver devices are connected in parallel to Vdd, such that the All-Locked signal is set to logic '1' only in response to all of the driver outputs being pulled to a logic '1'.

7. The apparatus of claim 2, wherein a driver output of each bi-directional driver/receiver device is held at logic '1' until the PLL of its corresponding chip achieves lock.

8. The apparatus of claim 7, wherein the driver outputs of the bi-directional driver/receiver devices are connected in parallel to ground, such that the All-Locked signal is set to logic '1' only in response to all of the driver outputs being pulled to a logic '0'.

9. The apparatus of claim 1, wherein the circuit for receiving the lock signal from each PLL and for generating an All-Locked signal in response to all of the PLLs achieving lock includes a circuit for wire-ANDing together the lock signals from each PLL.

10. The apparatus of claim 1, wherein the circuit for receiving the lock signal from each PLL and for generating an All-Locked signal in response to all of the PLLs achieving lock includes a circuit for wire-ORing together the lock signals from each PLL.

11. The apparatus of claim 1, wherein the system clock signal of each chip is generated using clock divider circuitry, and wherein the system clock signals are generated in phase with each other in response to receipt of the All-Locked signal.

12. The apparatus of claim 1, wherein, for at least one PLL, an externally supplied lock signal is used to indicate a lock status of the PLL.

13. A method comprising:
   providing a plurality of chips, each chip including a phase locked loop (PLL) and a circuit for generating a system clock signal;
   generating an All-Locked signal in response to all of the PLLs achieving lock; and
   synchronizing the system clock signals of the plurality of chips in response to receipt of the All-Locked signal, wherein the system clock signals are in phase.

14. The method of claim 13, further comprising generating the All-Locked signal by wire-ANDing an output of each chip indicative of PLL lock to Vdd, or by wire-ORing an output of each chip indicative of PLL lock to ground and using an inverted result thereof.

15. The method of claim 13, further comprising preventing generation of the All-Locked signal if any of the PLLs have not achieved lock.

16. The method of claim 13, wherein each chip further includes a bi-directional driver/receiver device for receiving the lock signal from the PLL of the chip, further comprising connecting a driver output of each bi-directional driver/receiver device in parallel to Vdd.

17. The method of claim 16, further comprising holding the driver output of each bi-directional driver/receiver device at logic '0' until the PLL of its corresponding chip achieves lock.

18. The method of claim 13, wherein each chip further includes a bi-directional driver/receiver device for receiving the lock signal from the PLL of the chip, further comprising connecting a driver: output of each bi-directional driver/receiver device in parallel to ground.

19. The method of claim 18, further comprising holding the driver output of each bi-directional driver/receiver device at logic '1' until the PLL of its corresponding chip achieves lock.

20. The method of claim 13, wherein, for at least one PLL, an externally supplied lock signal is used to indicate a lock status of the PLL.

* * * * *